(12) United States Patent
Seo

(10) Patent No.: US 10,653,047 B2
(45) Date of Patent: May 12, 2020

(54) ELECTROMAGNETIC WAVE SHIELDING SHEET FOR SHIELD-CAN

(71) Applicant: AMOGREENTECH CO., LTD., Gimpo-si (KR)

(72) Inventor: In Yong Seo, Seoul (KR)

(73) Assignee: AMOGREENTECH CO., LTD., Gimpso-si (KR)

( * ) Notice: Subject to any disclaimer, the term of this patent is extended or adjusted under 35 U.S.C. 154(b) by 0 days.

(21) Appl. No.: 16/346,813

(22) PCT Filed: Nov. 2, 2017

(86) PCT No.: PCT/KR2017/012316
§ 371 (c)(1),
(2) Date: May 1, 2019

(87) PCT Pub. No.: WO2018/084591
PCT Pub. Date: May 11, 2018

(65) Prior Publication Data
US 2019/0281734 A1 Sep. 12, 2019

(30) Foreign Application Priority Data

| Nov. 2, 2016 | (KR) | ......................... 10-2016-0145007 |
| May 10, 2017 | (KR) | ......................... 10-2017-0058086 |
| Sep. 18, 2017 | (KR) | ......................... 10-2017-0119473 |

(51) Int. Cl.
*H05K 9/00* (2006.01)
*H05K 1/02* (2006.01)

(52) U.S. Cl.
CPC .......... *H05K 9/0026* (2013.01); *H05K 1/023* (2013.01); *H05K 9/009* (2013.01); *H05K 9/0088* (2013.01); *H05K 2201/10371* (2013.01)

(58) Field of Classification Search
USPC ......................................................... 361/818
See application file for complete search history.

(56) References Cited

U.S. PATENT DOCUMENTS

| 6,653,556 | B2 * | 11/2003 | Kim | ..................... | H05K 9/0015 |
| | | | | | 174/358 |
| 7,732,714 | B2 * | 6/2010 | Hammaker | ............ | F16J 15/027 |
| | | | | | 174/356 |

(Continued)

FOREIGN PATENT DOCUMENTS

| JP | 2008-535257 | 8/2008 |
| KR | 2008-0005005 | 1/2008 |

(Continued)

OTHER PUBLICATIONS

International Search Report and Written Opinion issued in International Patent Application No. PCT/KR2017/012316, dated Mar. 9, 2018.

*Primary Examiner* — Hung S. Bui
(74) *Attorney, Agent, or Firm* — Norton Rose Fulbright US LLP

(57) ABSTRACT

An electromagnetic wave shielding sheet for a shield-can is disclosed, which is disposed between a metal bracket and a shield-can for shielding electromagnetic waves generated in a circuit element. It includes: a first conductive sheet part which includes a first conductive sheet having an electrical conductivity and conductive adhesive members disposed on both surfaces of the first conductive sheet; a pressure imparting member which is disposed on one surface of the first conductive sheet part and is compressible by an external force; and a second conductive sheet part which includes a second conductive sheet having an electrical conductivity and disposed on one surface of the first conductive sheet part (Continued)

to cover at least one surface of the pressure imparting member, and is electrically connected to the first conductive sheet part.

16 Claims, 13 Drawing Sheets

(56) References Cited

U.S. PATENT DOCUMENTS

| | | | | |
|---|---|---|---|---|
| 8,481,867 B2* | 7/2013 | Book | ................... | H05K 9/0016 |
| | | | | 174/355 |
| 8,853,562 B2* | 10/2014 | Izawa | ................... | H05K 9/0024 |
| | | | | 156/272.2 |
| 2010/0224399 A1 | 9/2010 | Song | | |
| 2015/0201533 A1* | 7/2015 | Daughtry, Jr. | ....... | H05K 9/0028 |
| | | | | 174/377 |
| 2016/0021798 A1 | 1/2016 | Kim | | |

FOREIGN PATENT DOCUMENTS

| | | |
|---|---|---|
| KR | 2010-0116367 | 11/2010 |
| KR | 2013-0136386 | 12/2013 |
| KR | 2014-0122815 | 10/2014 |

* cited by examiner

ELECTROMAGNETIC WAVE SHIELDING SHEET FOR SHIELD-CAN

CROSS-REFERENCE TO RELATED APPLICATIONS

This application is a national phase application under 35 U.S.C. § 371 of International Application No. PCT/KR2017/012316, filed Nov. 2, 2017, which claims priority to and the benefit of Korean Patent Applications No. 10-2016-0145007, filed Nov. 2, 2016, No. 10-2017-0058086, filed May 10, 2017, and No. 10-2017-0119473, filed Sep. 18, 2017. The contents of the referenced patent applications are incorporated into the present application by reference.

FIELD OF THE DISCLOSURE

The present invention relates to an electromagnetic wave shielding sheet for a shield-can.

BACKGROUND

Most recent electronic devices include various elements mounted on a printed circuit board. Since the elements are sensitive to electromagnetic wave interference (EMI) generated by internal interference sources or external interference sources, malfunction of the electronic devices may occur due to electromagnetic waves.

An electromagnetic wave is a phenomenon of moving energy that includes an electric field and a magnetic field moving together in the form of sine waves. The electromagnetic wave is useful for an electronic device such as a wireless communication device or a radar but causes malfunction of electronic and communication devices and also has harmful effects on the human body.

The electric field is generated by a voltage and easily shielded when far away or by obstacles such as wood. However, the magnetic field is generated by a current and is inverse proportional to a distance and has a property of not being easily shielded. Accordingly, in an electronic device, electronic components such as elements mounted on a printed circuit board are covered by a shield-can formed of a metal to shield EMI generated by an interference source. Therefore, malfunction of the electronic device itself may be prevented and other electronic devices which are nearby may be prevented from being affected.

In general, sidewalls, in which upper and lower sides are open, and an upper plate may be separately manufactured in order to make the shield-can, and the shield-can is typically mounted on the printed circuit board using a method in which the upper plate is assembled on the upper portions of the sidewalls.

Meanwhile, the upper plate needs to have a sufficient thickness to completely fill a space between the shield-can and a metal bracket according to specifications of a product. However, in a case in which an overall thickness of the upper plate formed of a metal material is simply increased, a vertical resistance is increased, and thus there is a problem of degrading EMI shielding performance.

SUMMARY OF THE INVENTION

The present invention is directed to providing an electromagnetic wave shielding sheet for a shield-can in which a thickness tolerance may be supplemented and an overall thickness may be simply changed to a required level.

In addition, the present invention is directed to providing an electromagnetic wave shielding sheet for a shield-can capable of maintaining a state in which a conductive sheet is completely adhered to a shield-can.

In addition, the present invention is directed to providing an electromagnetic wave shielding sheet for a shield-can in which a vertical resistance is reduced and an electric conductivity is improved.

One aspect of the present invention provides an electromagnetic wave shielding sheet for a shield-can, which is disposed between a metal bracket and a shield-can for shielding an electromagnetic wave generated by a circuit element, the electromagnetic wave shielding sheet including: a first conductive sheet part which includes a first conductive sheet having an electric conductivity and conductive adhesive members disposed on both surfaces of the first conductive sheet; a pressure imparting member which is disposed on one surface of the first conductive sheet part and is compressible by an external force; and a second conductive sheet part which includes a second conductive sheet having an electric conductivity and disposed on one surface of the first conductive sheet part to cover at least one surface of the pressure imparting member and is electrically connected to the first conductive sheet part.

At least one of the first conductive sheet and the second conductive sheet may be a conductive fiber web in which a fiber of which an outer surface is coated with a conductive material is formed in a three-dimensional network structure.

As an example, the first conductive sheet may be a conductive fiber web in which a fiber of which an outer surface is coated with a conductive material is formed in a three-dimensional network structure, and the second conductive sheet may be a metal sheet.

As another example, each of the first conductive sheet and the second conductive sheet may be a conductive fiber web in which a fiber of which an outer surface is coated with a conductive material is formed in a three-dimensional network structure.

The pressure imparting member may be an elastic member having a non-conductive property. As an example, the elastic member may be a fiber web or sponge.

The second conductive sheet may include a first portion stacked on one surface of the pressure imparting member, and a second portion stacked on one surface of the first conductive sheet, wherein the first portion and the second portion may be formed as a stepped surface. Here, a distance from the first portion to the first conductive sheet may be relatively greater than a distance from the second portion to the first conductive sheet, and the second portion may be formed to surround an edge of the first portion such that the second portion may cover an edge of the first conductive sheet.

The first conductive sheet may include a first portion stacked on one surface of the pressure imparting member and a second portion stacked on one surface of the second conductive sheet, wherein the first portion and the second portion may be formed as a stepped surface. Here, a distance from the first portion to the second conductive sheet may be relatively greater than a distance from the second portion to the second conductive sheet.

An adhesive member may be interposed between a surface of the first portion and a surface of the pressure imparting member which face each other.

A step compensating member having a ring shape to compensate for a step with respect to the first portion may be disposed on one surface of the second portion.

The second portion may be disposed to be located inside the first portion. Here, the pressure imparting member may include a through part formed to pass through the pressure imparting member to surround an edge of the second portion.

In the electromagnetic wave shielding sheet for a shield-can, at least one opening having a predetermined area may be formed in a region corresponding to the circuit element disposed in the shield-can.

As an example, the opening may be formed in the first portion, and the opening may be formed to pass through both of the pressure imparting member and the second conductive sheet part.

As another example, the opening may be formed in the second portion, and the opening may be formed to pass through the second conductive sheet part.

In a case in which the above-described electromagnetic wave shielding sheet for a shield-can is interposed between the shield-can and the metal bracket, the electromagnetic wave shielding sheet for a shield-can may be in a compressed state to have a thickness which is in a range of ⅕ to 3/10 of an initial thickness of the electromagnetic wave shielding sheet.

According to the present invention, since an overall thickness is decreased with a predetermined ratio by compressing a pressure imparting member when an external force is applied, a thickness tolerance can be supplemented, EMI shielding performance is also maintained, and the overall thickness can be simply changed to a required level.

In addition, since a conductive sheet which is attached to a shield-can by an adhesive member can have flexibility, a state in which the conductive sheet is completely adhered to the shield-can can be maintained, and thus an electromagnetic wave shielding efficiency can be increased.

In addition, since a conduction path between conductive sheet parts can be formed with a minimum distance through a stepped surface, a vertical resistance can be decreased and thus an electric conductivity can be improved.

DETAILED DESCRIPTION OF THE INVENTION

Figure 1:
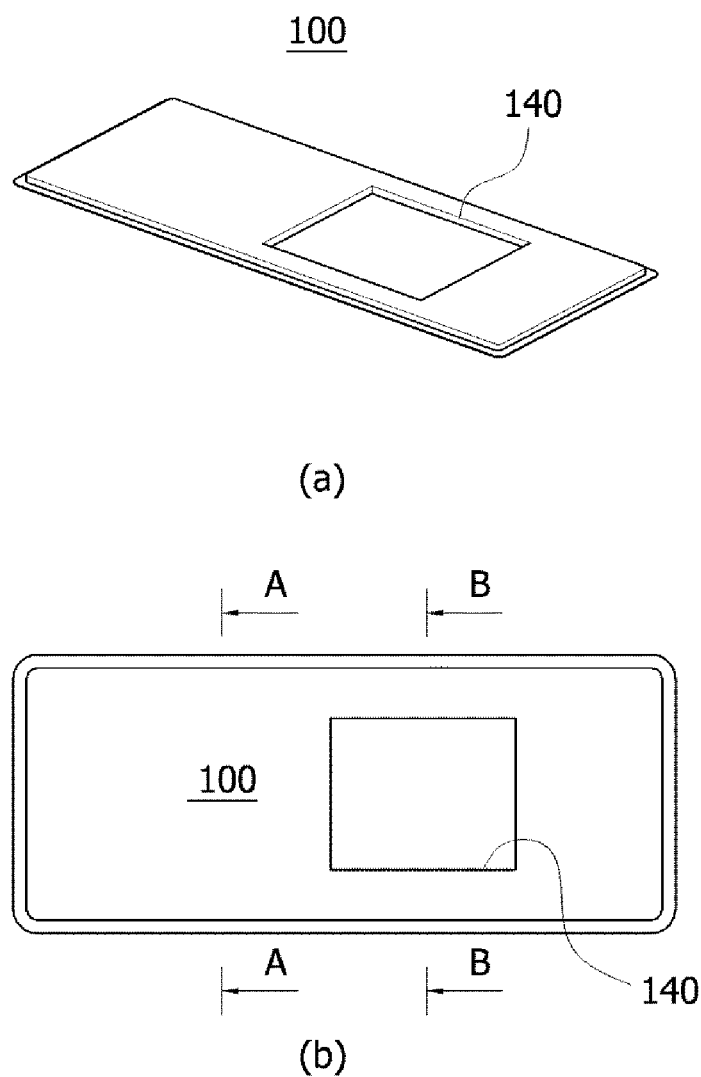
FIG. 1 is a schematic view illustrating a shielding sheet for a shield-can according to one embodiment of the present invention.

Hereinafter, embodiments will be described in detail with reference to the accompanying drawings to be easily performed by those skilled in the art. The embodiments of the present invention may be implemented in several different forms and are not limited to the embodiments described herein. Parts irrelevant to the description are omitted in the drawings in order to clearly explain the embodiments of the present invention. Similar parts are denoted by similar reference numerals throughout this specification.

Figure 8:
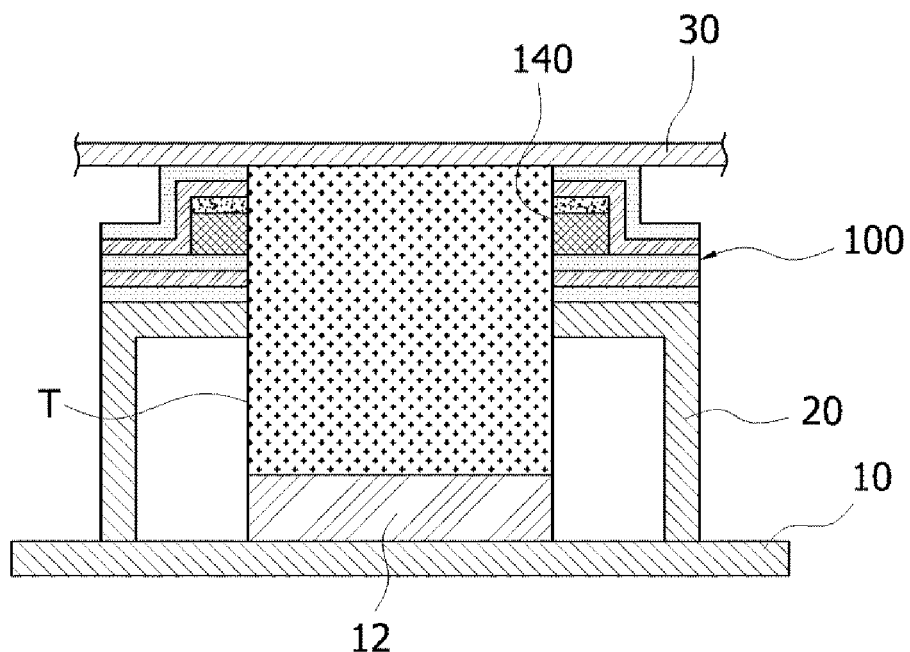
FIG. 8 is a cross-sectional view showing a usage state of the shielding sheet for a shield-can according to one embodiment of the present invention and taken the same line as line B-B of FIG. 1.
Figure 16:
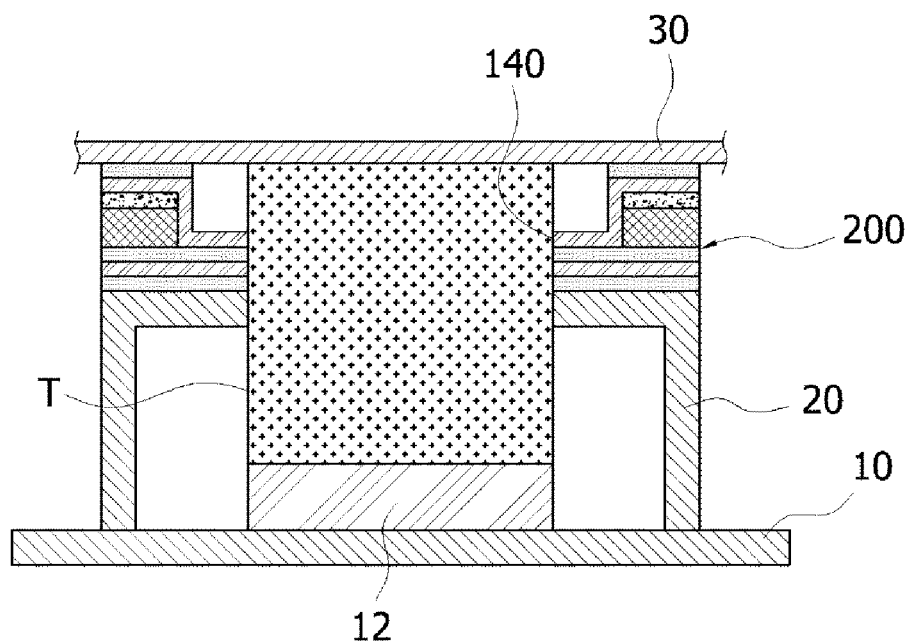
FIG. 16 is a cross-sectional view showing a usage state of a shielding sheet for a shield-can according to another embodiment of the present invention and taken the same line as line D-D of FIG. 9.
Figure 23:
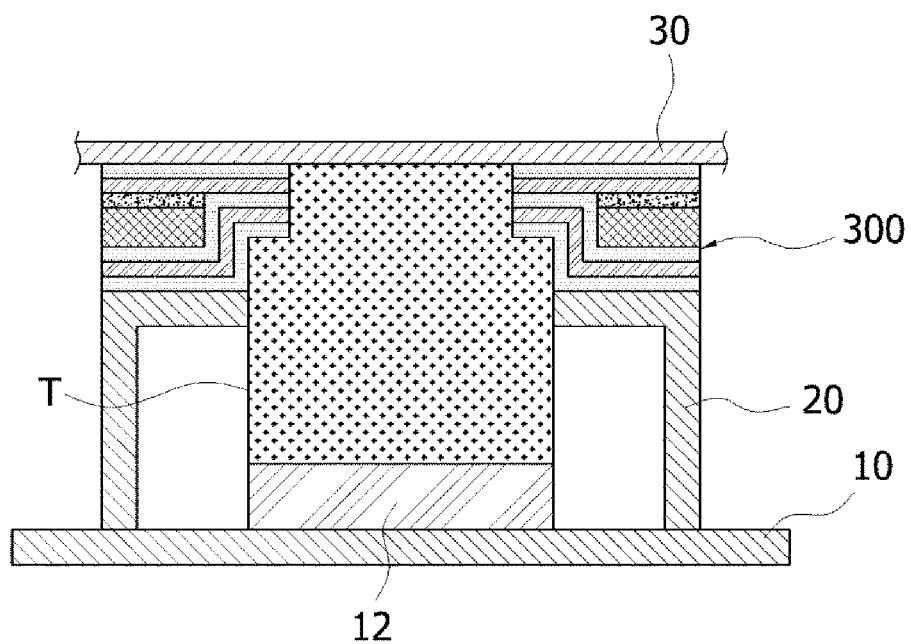
FIG. 23 is a cross-sectional view showing a usage state of the shielding sheet for a shield-can according to still another embodiment of the present invention and taken the same line as line F-F of FIG. 17.

Electromagnetic wave shielding sheets 100, 200, and 300 for a shield-can according to one embodiment of the present invention may shield an electromagnetic wave generated by a circuit element 12 together with a shield-can 20 as illustrated in FIGS. 8, 16, and 23.

That is, the electromagnetic wave shielding sheets 100, 200, and 300 for a shield-can according to one embodiment of the present invention may be disposed on an open upper side of the shield-can 20 and may prevent an electromagnetic wave generated by the circuit element 12 from leaking to the outside together with the shield-can 20.

In the present invention, the shield-can 20 may be disposed to surround the circuit element 12 mounted on a circuit board 10. The shield-can 20 may be formed of a metal material to shield an electromagnetic wave generated by the circuit element 12 and may have a hollow shape in which upper and lower portions thereof are open.

In addition, the circuit element 12 may be an electronic component such as an application processor (AP) for controlling overall driving of an electronic device but is not limited thereto and may be any known electronic component which may be mounted on the circuit board 10, generate an electromagnetic wave, and be surrounded by the shield-can 20.

The electromagnetic wave shielding sheets 100, 200, and 300 for a shield-can according to one embodiment of the present invention include a first conductive sheet part 110 or 210, a pressure imparting member 130 or 230, and a second conductive sheet part 120 or 220 as illustrated in FIGS. 1 to 23.

One surface of each of the first conductive sheet parts 110 and 210 may be may be attached to an upper side of the shield-can 20 and may shield the electromagnetic wave generated by the circuit element 12.

To this end, the first conductive sheet parts 110 and 210 may include a first conductive sheet 111 or 211 having a plate shape and an electric conductivity capable of shielding the electromagnetic wave, and a pair of conductive adhesive members 112 and 113 may be disposed on both surfaces of the first conductive sheet 111 or 211.

Accordingly, the first conductive sheet parts 110 and 210 may be attached to an upper portion of the shield-can 20 by the conductive adhesive member 112 disposed on a lower surface of the first conductive sheet 111 or 211 and may be attached to the second conductive sheet part 120 or 220 or the pressure imparting member 130 or 230 by the conductive adhesive member 113 disposed on an upper surface of the first conductive sheets 111 or 211.

Figure 2:
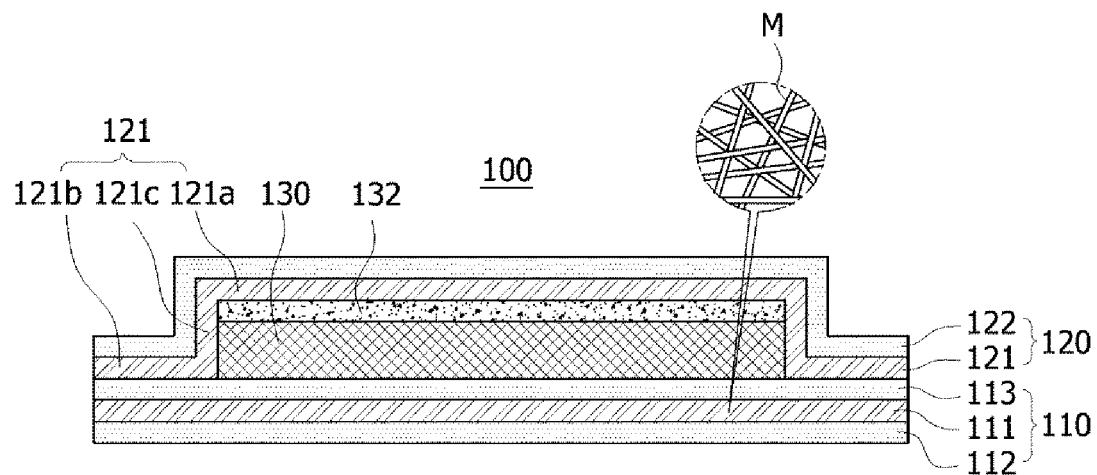
FIG. 2 is a cross-sectional view taken line A-A of FIG. 1.
Figure 10:
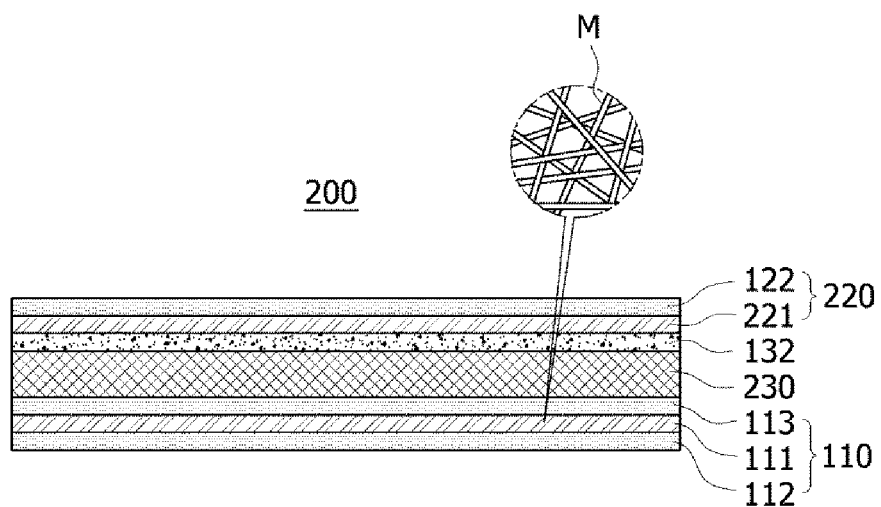
FIG. 10 is a cross-sectional view taken line C-C of FIG. 9.
Figure 18:
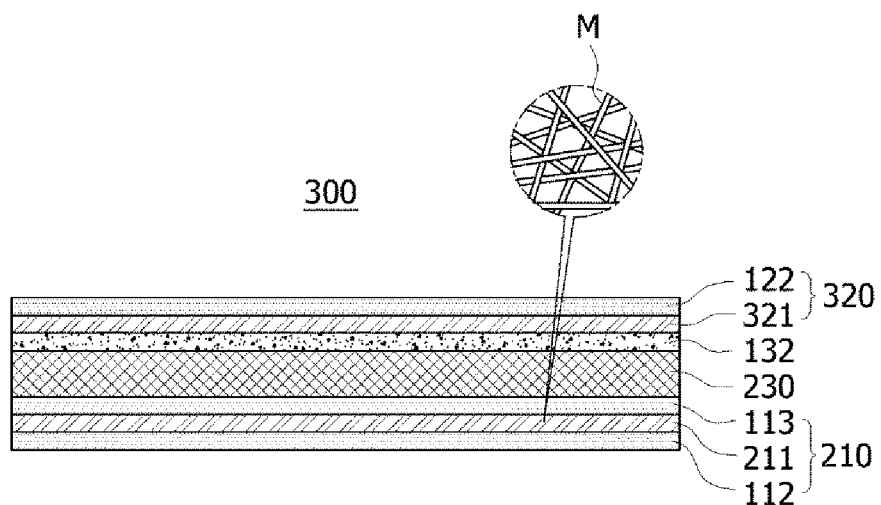
FIG. 18 is a cross-sectional view taken line E-E of FIG. 17.
Figure 24:
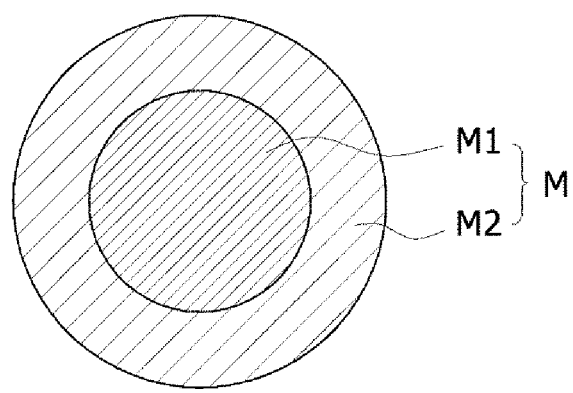
FIG. 24 is a cross-sectional view showing a detailed configuration of the conductive fiber web applicable to the present invention.

Here, as illustrated in FIGS. 2, 10, and 18, the first conductive sheets 111 and 211 may be a conductive fiber web M formed to have a three-dimensional network structure. In addition, as illustrated in FIG. 24, the conductive fiber web M may have a form in which an outer surface of a fiber M1 is coated with a conductive material M2.

Accordingly, even though a surface of the shield-can 20 is a surface which is not a completely flat surface and is slightly uneven, since the first conductive sheet 111 or 211 may be changed according to the slightly uneven surface of the shield-can 20, a state in which the first conductive sheet 111 and 211 is in surface contact with the surface of the shield-can 20 may always be maintained. Consequently, since the electromagnetic wave generated by the circuit element 12 may be fundamentally shielded from leaking through an interface between the first conductive sheet part 110 or 210 and the shield-can 20 or the leakage may be minimized, electromagnetic wave shielding performance may be further improved.

In addition, in a case in which the electromagnetic wave shielding sheets 100, 200, and 300 for a shield-can according to one embodiment of the present invention are interposed between the shield-can 20 and a metal bracket 30 and compressed by an external force, gaps between fibers M1 coated with the conductive material M2 may be narrowed due to a compressive force. Accordingly, gaps between the conductive materials M2 are narrowed, a vertical resistance is significantly decreased, an electric conductivity is improved, and thus electromagnetic wave shielding performance may be further improved.

In the present invention, any material which may be formed and maintained as a general fiber form may be used for the fiber M1 forming the conductive fiber web M without limitation. As a non-restrictive example about this, the fiber M1 may include one or more selected from the group consisting of polyurethane, polystylene, polyvinylalchol, polymethyl methacrylate, polylactic acid, polyethyleneoxide, polyvinyl acetate, polyacrylic acid, polycaprolactone, polyacrylonitrile, polyvinylpyrrolidone, polyvinylchloride, polycarbonate (PC), polyetherimide, polyesthersulphone, polybenzimidazole, polyethylene terephthalate, polybutylene terephtalate, and a fluorine compound. Preferably, the fiber M1 may be a fiber in which polyvinylidene fluoride or polyvinylidene difluoride (PVDF) and polyurethane, which are fluorinated compounds, are blended in a spinning solution and spun so that the conductive fiber web M may have improved compressibility, heat resistance, chemical resistance, and mechanical strength.

In addition, the outer surface of the fiber M1 may be coated with the conductive material M2 to provide an electric conductivity to the conductive fiber web M, and any material having an electric conductivity may be used for the conductive material M2 without limitation. As a non-restrictive example, the conductive material M2 may be formed of one or more metals selected from the group consisting of nickel, copper, silver, gold, chrome, and platinum, formed of one or more conductive polymer compounds, or formed in a form in which the metal and the conductive polymer compound are mixed.

The pressure imparting members 130 and 230 may be disposed between the first conductive sheet part 110 or 210 and the second conductive sheet part 120 or 220. A thickness of each of the pressure imparting members 130 and 230 may be decreased by an external force. Accordingly, an overall thickness of each of the electromagnetic wave shielding sheets 100, 200, and 300 for a shield-can according to one embodiment of the present invention may be decreased in a case in which an external force is applied thereto.

That is, in a case in which the electromagnetic wave shielding sheets 100, 200, and 300 for a shield-can according to one embodiment of the present invention are interposed between the shield-can 20 and the metal bracket 30, each of the electromagnetic wave shielding sheets 100, 200, and 300 for a shield-can may be compressed to a sufficient thickness by the pressure imparting member 130 or 230. Accordingly, since the electromagnetic wave shielding sheets 100, 200, and 300 for a shield-can according to one embodiment of the present invention may minimize compression of the first conductive sheet part 110 or 210 and the second conductive sheet part 120 or 220 themselves, the first conductive sheet part 110 or 210 and the second conductive sheet part 120 or 220 are prevented from being damaged, and each of the electromagnetic wave shielding sheets 100, 200, and 300 for a shield-can according to one embodiment of the present invention may be compressed to a sufficient thickness which is allowed in a mounting region.

To this end, the pressure imparting members 130 and 230 may be formed of a material capable of being compressed by an external force. That is, the pressure imparting members 130 and 230 may be formed of a known material which has an elastic restoring force by which a form is easily changed by an external force and the changed form is restored to an original form when the external force is removed. In addition, each of the pressure imparting members 130 and 230 may be a porous foam member in order for flexibility and lightness.

As a specific example, each of the pressure imparting members 130 and 230 may be a fiber web or a sponge. As a non-restrictive example, in a case in which each of the pressure imparting members 130 and 230 is formed of a fiber web, the fiber web may include a fiber including one or more selected from the group consisting of polyurethane, polystylene, polyvinylalchol, polymethyl methacrylate, polylactic acid, polyethyleneoxide, polyvinyl acetate, polyacrylic acid, polycaprolactone, polyacrylonitrile, polyvinylpyrrolidone, polyvinylchloride, PC, polyetherimide, polyethersulphone, polybenzimidazole, polyethylene terephthalate, polybutylene terephtalate, and a fluorine compound.

In addition, in a case in which each of the pressure imparting members 130 and 230 is the sponge, the sponge may include one or more selected from the group consisting of polyurethane, styrene butadiene rubber, polychloroprene rubber, nitrile rubber, butyl rubber, isoprene rubber, ethylene propylene rubber, silicone rubber, fluoro rubber, and acrylic rubber and may be foam-molded.

Consequently, in a case in which the electromagnetic wave shielding sheets 100, 200, and 300 for a shield-can according to one embodiment of the present invention are disposed in a space between the shield-can 20 and the metal bracket 30, even though the overall thickness of each of the electromagnetic wave shielding sheets 100, 200, and 300 for a shield-can is greater than a thickness which is allowed by the space, the electromagnetic wave shielding sheets 100, 200, and 300 may be sufficiently compressed by an external force, and thus the electromagnetic wave shielding sheets 100, 200, and 300 may be properly disposed in the space between the shield-can 20 and the metal bracket 30.

In addition, since the overall thickness of each of the electromagnetic wave shielding sheets 100, 200, and 300 for a shield-can according to one embodiment of the present invention may be decreased to a thickness in which the electromagnetic wave shielding sheets 100, 200, and 300 may be disposed in the space, and the thickness and a volume of each of the pressure imparting members 130 and 230 may be increased by a restoring force itself, the first conductive sheet part 110 or 210 and the second conductive sheet part 120 or 220 disposed above and under the pressure imparting member 130 or 230 may be pushed in an outward direction.

Accordingly, since the first conductive sheet parts 110 and 210 and the second conductive sheet parts 120 and 220 which are disposed at both sides of the pressure imparting member 130 or 230 may be moved toward the shield-can 20 and the metal bracket 30 by a restoring force of the pressure imparting member 130 or 230, a state in which one surfaces thereof are in surface contact with the shield-can 20 and the metal bracket 30 may always be maintained. Accordingly, the first conductive sheet parts 110 and 210 and the second conductive sheet parts 120 and 220 may respectively be easily electrically connected to the shield-can 20 and the metal bracket 30, and a gap may be minimized and prevented from being generated in an interface between the first conductive sheet part 110 or 210 and the shield-can 20. Consequently, an electromagnetic wave generated by the circuit element 12 may be fundamentally prevented from leaking through the gap in the interface between the first conductive sheet part 110 or 210 and the shield-can 20, or the leakage may be minimized.

As an example, in a state in which the electromagnetic wave shielding sheets 100, 200, and 300 for a shield-can according to one embodiment of the present invention are compressed to have a thickness which is in the range of 70 to 80% of an initial thickness, the electromagnetic wave shielding sheets 100, 200, and 300 for a shield-can according to one embodiment of the present invention may be installed between the shield-can 20 and the metal bracket 30. That is, in a case in which the electromagnetic wave shielding sheets 100, 200, and 300 for a shield-can according to one embodiment of the present invention are inserted into the space formed between the shield-can 20 and the metal bracket 30, each of the electromagnetic wave shielding sheets 100, 200, and 300 for a shield-can according to one embodiment of the present invention may be in a state in which it is compressed to a thickness which is in the range of $1/5$ to $3/10$ of the initial thickness.

Accordingly, in a state in which the electromagnetic wave shielding sheets 100, 200, and 300 for a shield-can according to one embodiment of the present invention are compressed, one surface of each of the electromagnetic wave shielding sheets 100, 200, and 300 for a shield-can according to one embodiment of the present invention may be in direct contact with the shield-can 20, and the other surface thereof may be in direct contact with the metal bracket 30. Consequently, the electromagnetic wave shielding sheets 100, 200, and 300 for a shield-can may be electrically connected to the shield-can 20 and the metal bracket 30, and an electromagnetic wave generated by the circuit element 12 may be emitted after moving to the ground side through the shield-can 20 and the metal bracket 30.

As a specific example, the overall thickness of each of the electromagnetic wave shielding sheets 100, 200, and 300 for a shield-can before being compressed may be 400 μm, and the thickness thereof in a state in which each of the electromagnetic wave shielding sheets 100, 200, and 300 for a shield-can is compressed to be inserted into the space between the shield-can 20 and the metal bracket 30 may be in the range of 150 to 250 μm. However, the overall thickness of each of the electromagnetic wave shielding sheets 100, 200, and 300 for a shield-can according to one embodiment of the present invention and the thickness thereof in the state in which each of the electromagnetic wave shielding sheets 100, 200, and 300 for a shield-can is compressed are not limited thereto, and it may be understood that each of the electromagnetic wave shielding sheets 100, 200, and 300 for a shield-can may be compressed to the sufficient thickness with respect to the initial thickness, and each of the electromagnetic wave shielding sheets 100, 200, and 300 for a shield-can may be formed with a proper thickness in consideration of overall thickness specifications of an applied electronic device, thickness tolerances of the shield-can 20 and the metal bracket 30, and the like.

Here, each of the pressure imparting members 130 and 230 may have a size or a cross sectional area which is less than that of the first conductive sheet 111 or 211 and that of the second conductive sheet 121 or 221 and may be formed to be disposed between the first conductive sheet part 110 or 210 and the second conductive sheet part 120 or 220. This will be described below.

Meanwhile, each of the pressure imparting members 130 and 230 may be a conductive or non-conductive member. As an example, each of the pressure imparting members 130 and 230 may be formed of a material having both of an elastic force and an electric conductivity and may be a form in which an electric conductive component is separately contained in a material having an elastic force. As one specific example, the conductive pressure imparting member may be a conductive fiber web in which a plating layer is formed on an outer surface of a fiber or a conductive sponge in which a plating layer including inner surfaces of voids is formed. However, in order to reduce material costs, each of the pressure imparting members 130 and 230 may be formed of a non-conductive material.

The second conductive sheet parts 120 and 220 are stacked on one surface of the first conductive sheet part 110 or 210 and may be stacked on the first conductive sheet part 110 or 210 such that at least a part of each of the second conductive sheet parts 120 and 220 covers the pressure imparting member 130 or 230. One surface of each of the second conductive sheet parts 120 and 220 may be in surface contact with the metal bracket 30 when the second conductive sheet part 120 or 220 is used.

Here, since the second conductive sheet parts 120 and 220 have electrically conductive properties, the second conductive sheet parts 120 and 220 may electrically connect the first conductive sheet part 110 or 210 to the metal bracket 30.

To this end, the second conductive sheet parts 120 and 220 may include a second conductive sheet 121 or 221 having an electric conductivity, and a conductive adhesive member 122 may be disposed on at least one surface of the second conductive sheet 121 or 221.

That is, since the second conductive sheet parts 120 and 220 may be attached to the first conductive sheet part 110 or 210 by the conductive adhesive member 113 disposed on upper surface of the first conductive sheet 111, the second conductive sheet parts 120 and 220 may be integrated with the first conductive sheet part 110 or 210.

In addition, in a case in which the electromagnetic wave shielding sheets 100, 200, and 300 according to one embodiment of the present invention are disposed to be inserted into the space between the shield-can 20 and the metal bracket 30, the electromagnetic wave shielding sheets 100, 200, and 300 for a shield-can may be attached to one surface of the metal bracket 30 by the conductive adhesive member 122 disposed on one surface of the second conductive sheet 121 or 221.

However, the second conductive sheet parts 120 and 220 are not limited thereto, and the conductive adhesive member 122 disposed on one surface of the second conductive sheet 121 or 221 may be omitted.

In the present invention, each of the second conductive sheets 121 and 221 may be formed of a material which is different from or the same as that of the first conductive sheet 111.

Figure 3:
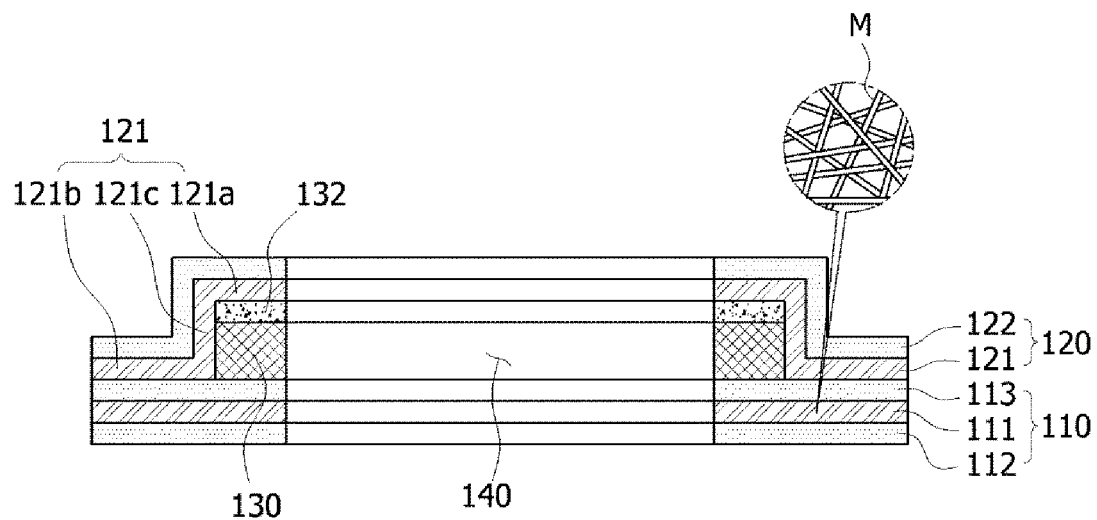
FIG. 3 is a cross-sectional view taken line B-B of FIG. 1.
Figure 11:
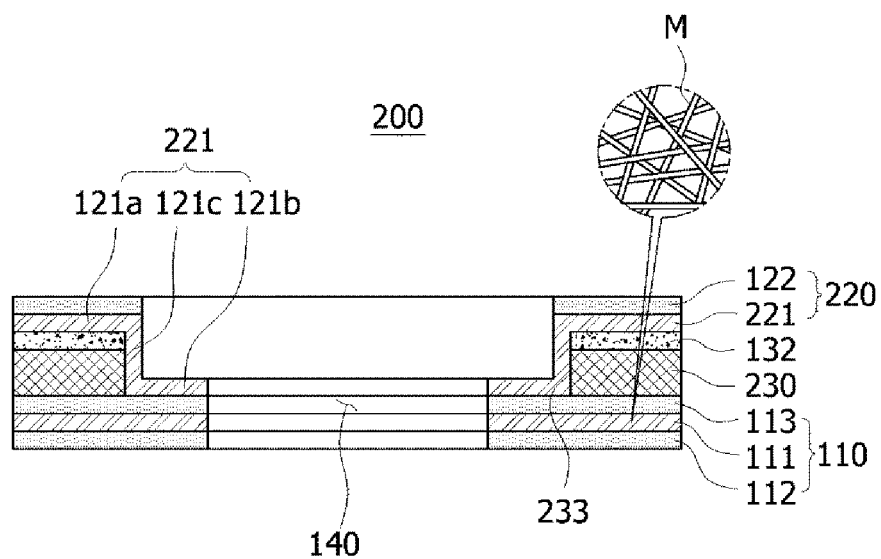
FIG. 11 is a cross-sectional view taken line D-D of FIG. 9
Figure 19:
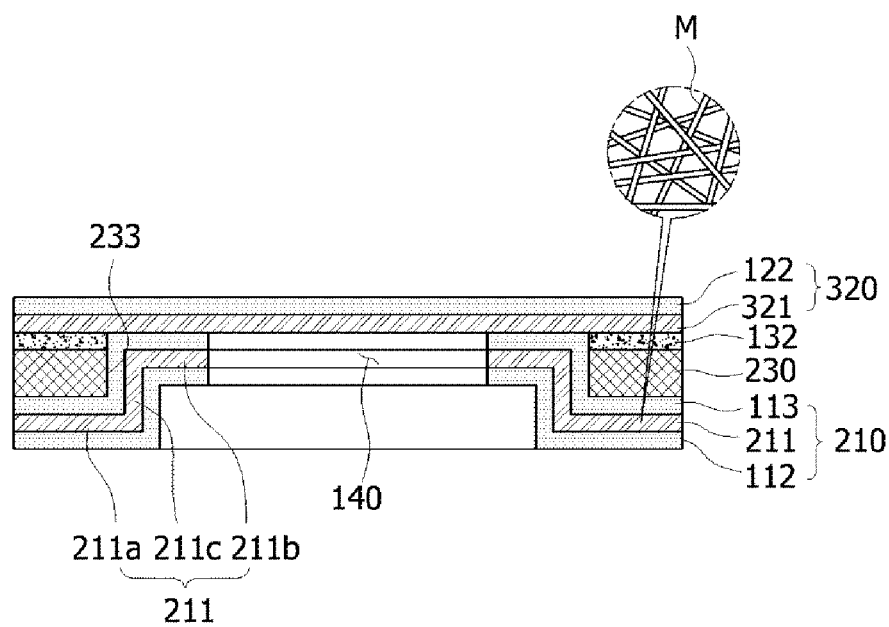
FIG. 19 is a cross-sectional view taken line F-F of FIG. 17.

As an example, as illustrated in FIGS. 3, 11, and 19, each of the second conductive sheets 121 and 221 may be a thin metal sheet which is formed of metal such as a copper foil or aluminum and the like.

Figure 4:
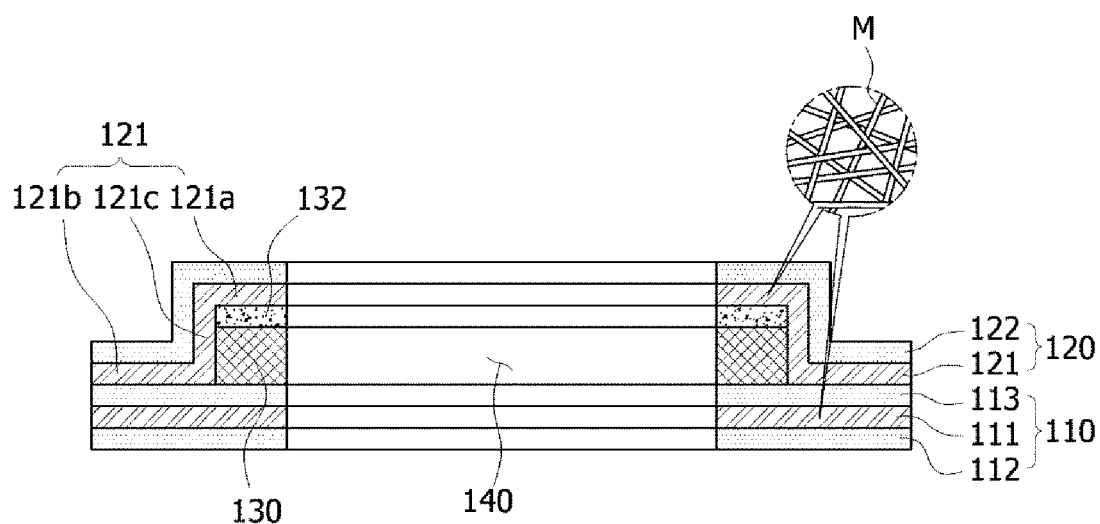
FIG. 4 is a view showing a case in which a second conductive sheet is formed of a conductive fiber web in FIG. 3.
Figure 5:
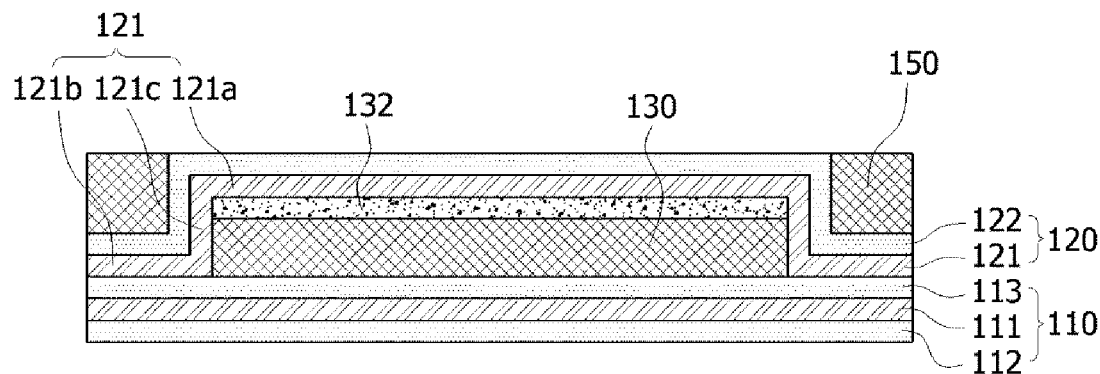
FIG. 5 is a view showing a state in which a step compensating member is applied to that shown in FIG. 2.
Figure 6:
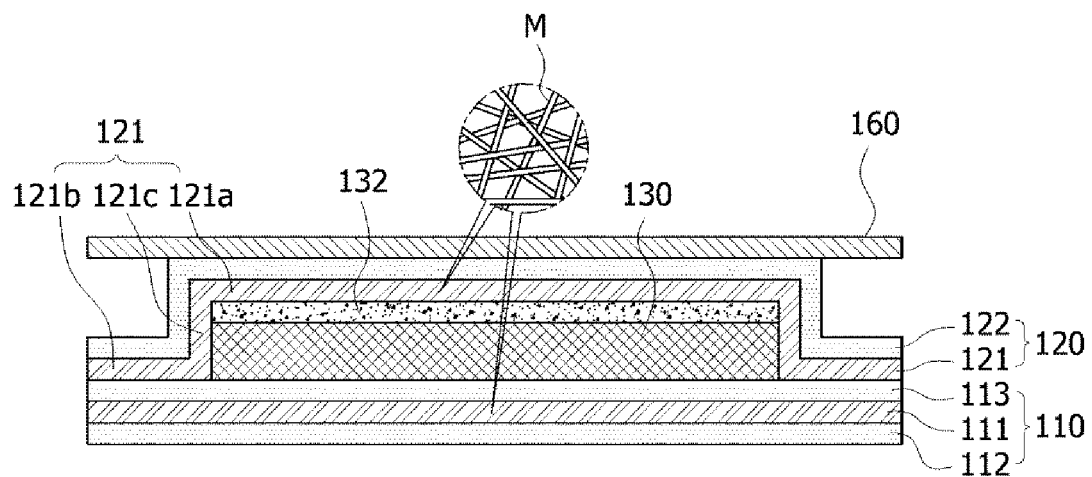
FIG. 6 is a view showing a state in which a metal sheet is applied to the form of FIG. 4.
Figure 12:
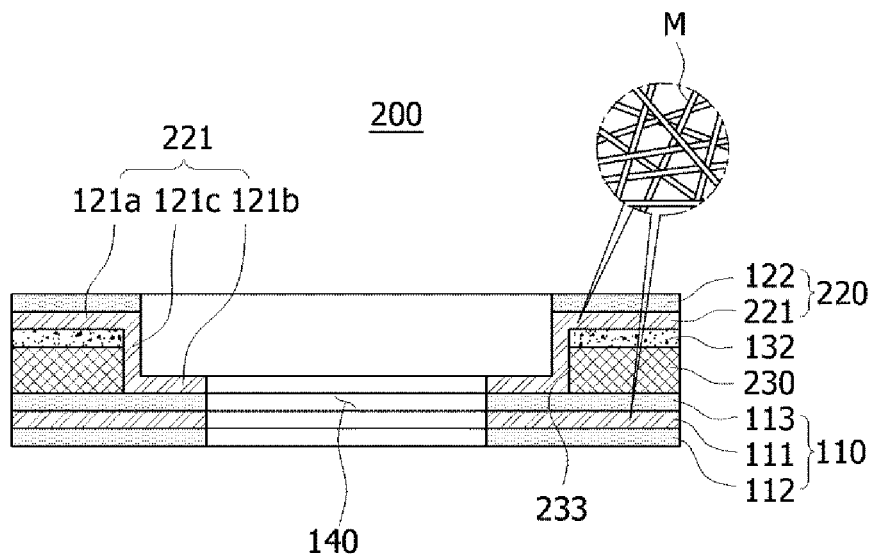
FIG. 12 is a view showing a case in which a second conductive sheet is formed of a conductive fiber web in FIG. 10.
Figure 13:
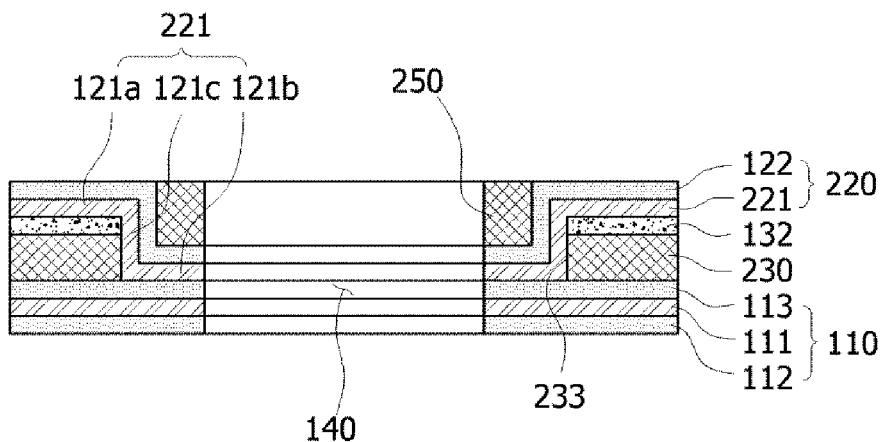
FIG. 13 is a view showing a state in which a step compensating member is applied to that shown in FIG. 11.
Figure 14:
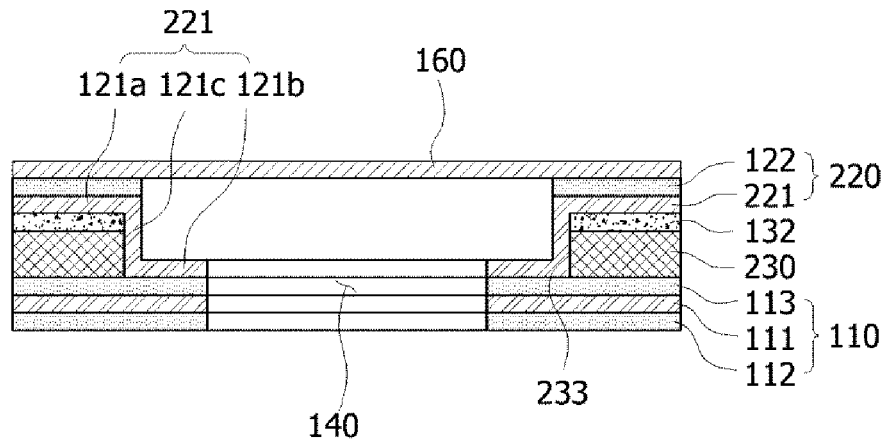
FIG. 14 is a view showing a state in which a metal sheet is applied to that shown in FIG. 11.
Figure 20:
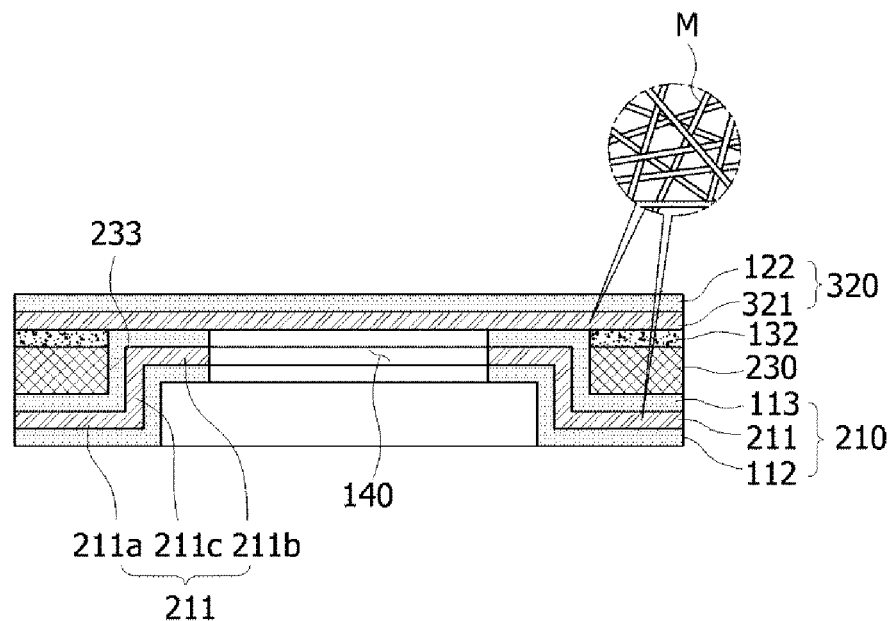
FIG. 20 is a view showing a case in which a second conductive sheet is formed of a conductive fiber web in FIG. 19.

As another example, as illustrated in FIGS. 4, 12, and 20, each of the second conductive sheets 121 and 221 may be a conductive fiber web M in which a fiber M1, of which an outer surface is coated with a conductive material M2, is formed to have a three-dimensional network structure like the first conductive sheet 111 or 211. In this case, since each of the second conductive sheets 121 and 221 may have flexibility and compressibility, even though a surface of the metal bracket 30 is a surface which is not a completely flat surface and is slightly uneven, a state in which each of the second conductive sheets 121 and 221 is in surface contact with the metal bracket 30 may always be maintained. Accordingly, a conductivity between each of the second conductive sheets 121 and 221 and the metal bracket 30 may be increased. In addition, in a case in which the second conductive sheets 121 and 221 are compressed by an external force, gaps between the fibers M1 coated with the conductive material M2 are narrowed, a vertical resistance is significantly decreased, and thus an electric conductivity may be improved.

Meanwhile, in a case in which the conductive adhesive member 122 is disposed on one surface of the second conductive sheet 121 or 221, the conductive adhesive member 122 may be formed of a material, which is different from that of the conductive adhesive members 112 and 113 disposed at least one surface of the first conductive sheet 111 or 211, or may be formed of the same material as the conductive adhesive members 112 and 113.

Here, a size or an area of each of the first conductive sheet parts 110 and 210 and a size or an area of each of the second conductive sheet parts 120 and 220 according to one embodiment of the present invention may be greater than that of the pressure imparting member 130 or 230. Accordingly, at least a part of each of the first conductive sheet parts 110 and 210 and at least a part of each of the second conductive sheet parts 120 and 220 may be disposed to cover one surface of the pressure imparting member 130 or 230, and the other parts thereof may be directly stacked on one surface of each of the other conductive sheet parts with the conductive adhesive member 113 disposed therebetween. Accordingly, since a current may flow from each of the first conductive sheet parts 110 and 210 to the second conductive sheet part 120 or 220 through the other parts, a conduction path between the first conductive sheet 111 or 211 and the second conductive sheet 121 or 221 may be formed with the shortest distance.

As one embodiment, as illustrated in FIGS. 3 and 11, each of the second conductive sheets 121 and 221 may include a first portion 121a directly stacked one surface of the pressure imparting member 130 or 230, and a second portion 121b directly stacked on one surface of the first conductive sheet 111, and the first portion 121a and the second portion 121b may be connected to each other by a third portion 121c having a predetermined height and a ring shape. In this case, each of the pressure imparting members 130 and 230 may be disposed at only a region corresponding to the first portion 121a between the first conductive sheet part 110 and the second conductive sheet part 120 or 220.

Accordingly, the pressure imparting members 130 and 230 are not disposed between the second portion 121b and the first conductive sheet 111 but may be disposed between only the first portion 121a and the first conductive sheet 111. In addition, one surface of the first portion 121a and the second portion 121b may be formed as a stepped surface having a step corresponding to the thickness of the pressure imparting member 130 or 230.

Consequently, a distance from the first portion 121a to the first conductive sheet 111 may be relatively longer than a distance from the second portion 121b to the first conductive sheet 111.

In other words, since the pressure imparting members 130 and 230 may be not disposed between the second portion 121b and the first conductive sheet 111, the shortest distance between the second portion 121b and the first conductive sheet 111 may always be maintained regardless of the overall thickness of the pressure imparting member 130 or 230.

Accordingly, in the electromagnetic wave shielding sheets 100 and 200 for a shield-can according to one embodiment of the present invention, the first conductive sheet 111 and the second conductive sheet 121 or 221 may be electrically connected to each other by the second portion 121b which is relatively close thereto. Consequently, since a conduction path may be formed with a minimum distance from the first conductive sheet 111 to the second conductive sheet 121 or 221, a vertical resistance may be decreased, and thus an electric conductivity may be improved.

In addition, since the conduction path may always be formed with the minimum distance through the second portion 121b, even though the thickness of each of the pressure imparting members 130 and 230 is increased to increase the overall thickness of the shielding sheet 100 or 200, a conductivity between the sheets may be constantly maintained instead of being decreased, and a thickness of a portion which becomes the conduction path between the sheets may be maintained at a sufficiently thin thickness.

Consequently, since the overall thickness of each of the pressure imparting members 130 and 230 may be freely changed while a conductivity between the first conductive sheet part 110 and the second conductive sheet part 120 or 220 is still maintained, the overall thickness of each of the shielding sheets 100 and 200 may be freely increased or decreased, and thus a degree of design freedom may be improved.

Accordingly, in the electromagnetic wave shielding sheets 100 and 200 according to one embodiment of the present invention, even though an overall thickness of the first conductive sheet 111 and the second conductive sheet 121 or 221 is not increased, in a case in which each of the pressure imparting members 130 and 230 has a sufficient thickness, the overall thickness may be sufficiently increased to a target thickness.

In addition, since the distance from the first conductive sheet 111 to the second conductive sheet 121 may be minimized on the conduction path, a vertical resistance is reduced, and thus an electric conductivity may be improved. Even though the overall thickness is sufficient, since the electromagnetic wave shielding sheets 100 and 200 according to one embodiment of the present invention may be sufficiently compressed by the pressure imparting member 130 or 230, the overall thickness may be freely changed to a thickness required in use.

Here, an adhesive member 132 may be interposed between the pressure imparting member 130 or 230 and the first portion 121a which face each other, and the adhesive member 132 may have a conductivity, but the adhesive member 132 may have a non-conductive property in consideration of material costs.

Here, the second portion 121b of each of the second conductive sheets 121 and 221 may be formed to be positioned at an edge side of the first conductive sheet 111 or positioned inside the first conductive sheet 111.

As an example, as illustrated in FIGS. 1 to 8, since the second portion 121b may be disposed to surround an edge of the first portion 121a, the second conductive sheet 121 may be stacked on the first conductive sheet part 110 to cover an edge of the first conductive sheet part 110.

In this case, the pressure imparting member 130 may be formed in a plate shape having a predetermined area and a predetermined thickness and may have a relatively smaller size than the second conductive sheet 121 and the first conductive sheet 111.

Accordingly, the pressure imparting member 130 may be disposed in an inner region of the first conductive sheet 111, and the second portion 121b may be disposed to surround an edge of the pressure imparting member 130 and directly stacked on one surface of the first conductive sheet 111 with the conductive adhesive member 113 disposed therebetween.

As another example, as illustrated in FIGS. 9 to 16, the second conductive sheet 221 may be formed such that the second portion 121b is positioned inside the first portion 121a, and a partial inner area of an overall area of the second conductive sheet 221 corresponding to the second portion 121b may be convexly formed downward.

In this case, in the pressure imparting member 230, a through part 233 having a predetermined area may be formed to pass through a region corresponding to the second portion 121b, and a size of the through part 233 may be relatively greater than that of the second portion 121b.

Accordingly, the pressure imparting member 230 may be disposed such that the through part 233 surrounds an edge of the second portion 121b, and since the second portion 121b may be disposed inside the through part 233, the second portion 121b may be directly stacked on one surface of the first conductive sheet 111 with the conductive adhesive member 113 disposed therebetween.

In the present invention, in a case in which the second portion 121b is formed to be positioned inside the first portion 121a, the second portion 121b may be formed in with a plurality of second portions.

As another embodiment, as illustrated in FIG. 19, the first conductive sheet 211 may include a first portion 211a directly stacked on the pressure imparting member 230 and a second portion 211b directly stacked on one surface of a second conductive sheet 321, and the first portion 211a and the second portion 211b may be connected to each other by a third portion 211c having a predetermined height and a ring shape. In this case, the pressure imparting member 230 may be disposed at only a region corresponding to the first portion 211a between the first conductive sheet part 210 and a second conductive sheet part 320.

Accordingly, the pressure imparting member 230 is not disposed between the second portion 211b and the second conductive sheet 321 and may be disposed only between the first portion 211a and the second conductive sheet 321. In addition, a surface of the first portion 211a and the second portion 211b may be formed as a stepped surface substantially having a step corresponding to the thickness of the pressure imparting member 230.

Consequently, a distance from the first portion 211a to the second conductive sheet 321 may be relatively longer than a distance from the second portion 211b to the second conductive sheet 321.

In other words, since the pressure imparting member 130 may be not disposed between the second portion 211b and the second conductive sheet 321, a conduction path with a minimum distance may be formed regardless of the overall thickness of the pressure imparting member 230.

Accordingly, in the electromagnetic wave shielding sheet 300 for a shield-can according to one embodiment of the present invention, the first conductive sheet 211 and the second conductive sheet 321 which are stacked on each other in a vertical direction may be electrically connected to each other through the second portion 211b which is relatively close thereto.

Consequently, since a conduction path between the first conductive sheet 211 and the second conductive sheet 321 may be formed with a minimum distance, a vertical resistance may be decreased and thus an electrically conductivity may be improved.

In addition, since the conduction path with the minimum distance may always be formed through the second portion 211b, even though the thickness of the pressure imparting member 230 is increased in order to increase the overall thickness of the shielding sheet 300, a conductivity between the sheets may not be degraded and may be constantly maintained, and a thickness of a region, which is the conduction path between the sheets, may be maintained at a sufficiently thin thickness.

Consequently, while the conductivity between the first conductive sheet part 210 and the second conductive sheet part 320 is still maintained, the overall thickness of the pressure imparting member 230 may be freely changed, and thus an overall thickness of the shielding sheet 300 may be freely increased or decreased, and thus a degree of design freedom may be increased.

Accordingly, in the electromagnetic wave shielding sheet 300 according to one embodiment of the present invention, even though an overall thickness of the first conductive sheet 211 and the second conductive sheet 321 is not increased, in a case in which the pressure imparting member 230 has a sufficient thickness, the overall thickness may be sufficiently increased to a target thickness.

In addition, since a distance from the first conductive sheet 211 to the second conductive sheet 321 may be minimized on the conduction path, a vertical resistance may be decreased, and an electrical conductivity may be improved. In addition, even though the overall thickness of the shielding sheet 300 is sufficient, since the shielding sheet 300 may be sufficiently compressed through the pressure imparting member 230, the thickness thereof may be freely changed to a thickness required in use.

Here, the adhesive member 132 may be interposed between the pressure imparting member 230 and the first portion 211a which face each other, and the adhesive member 132 may have a conductivity, but may have a non-conductive property in consideration of material costs.

Here, the second portion 211b of the first conductive sheet 211 may be formed inside the second conductive sheet 321.

That is, as illustrated in FIGS. 17 to 23, the first conductive sheet 211 may be formed such that the second portion 211b is positioned inside the first portion 211a, and a partial inner area of an overall area of the first conductive sheet 211 corresponding to the second portion 211b may be convexly formed upward.

In this case, in the pressure imparting member 230, the through part 233 having the predetermined area may be formed to pass through a region corresponding to the second portion 211b, and the size of the through part 233 may be relatively greater than that of the second portion 211b.

Accordingly, the pressure imparting member 230 may be disposed such that the through part 233 surrounds an edge of the second portion 211b, and since the second portion 211b may be disposed inside the through part 233, the second portion 211b may be directly stacked on one surface of the second conductive sheet 321 with the conductive adhesive member 113 disposed therebetween.

As described above, in the electromagnetic wave shielding sheets 100, 200, and 300 for a shield-can according to one embodiment of the present invention, one of the first conductive sheet part 110 or 210 and the second conductive sheet part 120 or 220 is formed to have a stepped structure having the first portion 211a or 121a and the second portion 211b or 121b, and the thickness of the pressure imparting member 130 or 230 may be allowed by a step height. Accordingly, the electromagnetic wave shielding sheets 100, 200, and 300 for a shield-can according to one embodiment of the present invention may be simply manufactured using a simple stacking method.

That is, since the first conductive sheet part 110 or 210, the pressure imparting member 130 or 230, and the second conductive sheet part 120 or 220 may be sequentially stacked on each other to complete a product, a manufacturing process can be simplified, and assembly productivity can be increased.

In addition, in the electromagnetic wave shielding sheets 100, 200, and 300 for a shield-can according to one embodiment of the present invention, the first conductive sheet part 110 or 210, the pressure imparting member 130 or 230, and the second conductive sheet part 120 or 220 may be individually produced and then may be stacked on each other in order to realize one product. Accordingly, in the electromagnetic wave shielding sheets 100, 200, and 300 for a shield-can according to one embodiment of the present invention, the first conductive sheet part 110 or 210 and the second conductive sheet part 120 or 220 may be formed in various shapes suitable for a shape of the shield-can 20 using a shaping process.

Figure 9:
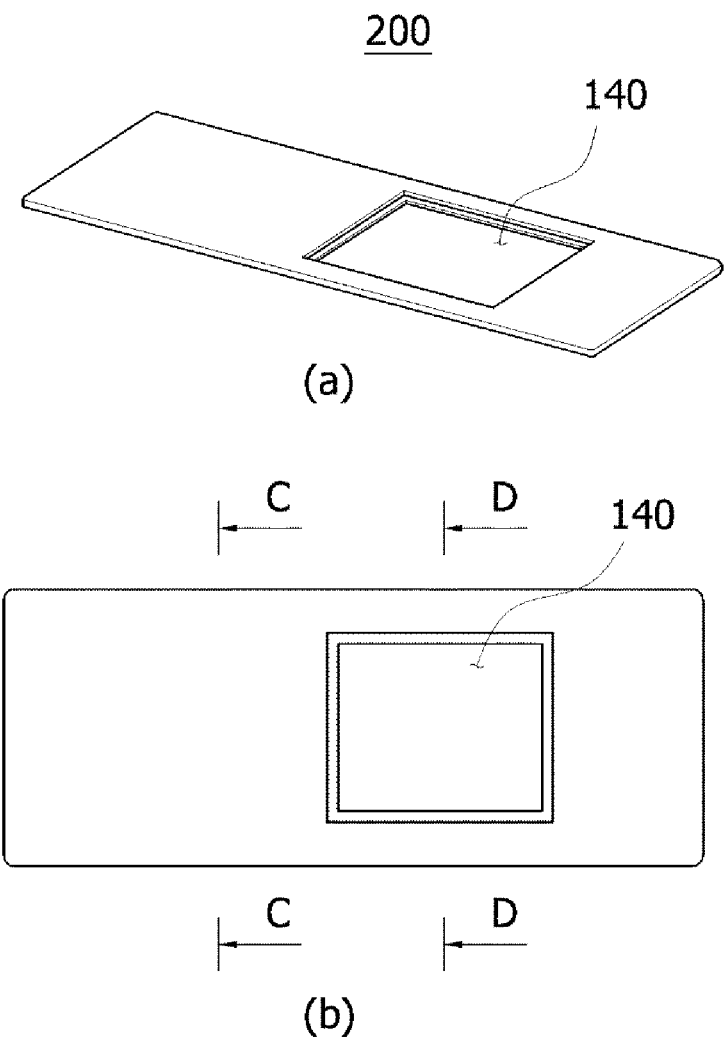
FIG. 9 is a schematic view illustrating a shielding sheet for a shield-can according to another embodiment of the present invention.
Figure 17:
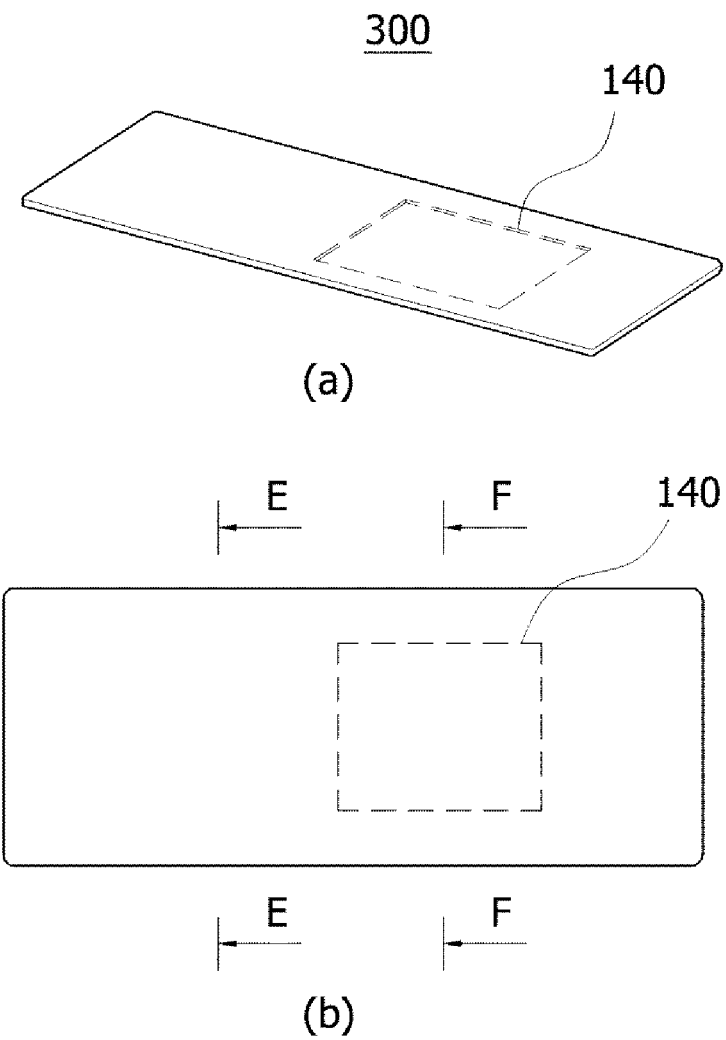
FIG. 17 is a schematic view illustrating a shielding sheet for a shield-can according to still another embodiment of the present invention.

Meanwhile, an opening 140 having a predetermined area may be formed in each of the electromagnetic wave shielding sheets 100, 200, and 300 for a shield-can according to one embodiment of the present invention (see FIGS. 1, 9, and 17)

Since the opening 140 may provide a path through which heat generated when the circuit element 12 mounted on the circuit board 10 operates is transferred to the metal bracket 30, various problems such as malfunction and the like due to the heat of the circuit element 12 may be solved.

To this end, as illustrated in FIGS. 8, 16, and 23, the opening 140 may be formed at a region corresponding to the circuit element 12 positioned inside the shield-can 20. The opening 140 may be formed using a punching process, but is not limited thereto and may be formed using a known cutting process such as a laser process.

Here, as illustrated in FIGS. 1 to 8, in the electromagnetic wave shielding sheet 100 for a shield-can according to one embodiment of the present invention, in a case in which the second portion 121b is formed to surround the edge of the first portion 121a, the opening 140 may be formed inside the first portion 121a and be formed to pass through both of the first conductive sheet part 110 and the pressure imparting member 130 (see FIG. 3). In this case, the opening 140 may be formed to pass through the second conductive sheet part 120 or may also be formed to pass through only both of the first conductive sheet part 110 and the pressure imparting member 130 so that the opening 140 may be sealed by the second conductive sheet part 120.

As another example, as illustrated in FIGS. 9 to 23, in the electromagnetic wave shielding sheet 200 for a shield-can according to one embodiment of the present invention, in a case in which the second portion 121b is convexly formed inside the first portion 121a, the opening 140 may be formed in the second portion 121b.

As a specific example, as illustrated in FIG. 11, the opening 140 may be formed to pass through both of the first conductive sheet part 110 or 210 and the second conductive sheet part 120. In this case, the second portion 121b may be positioned inside the first portion 121a and may define an edge of the opening 140. In addition, as illustrated in FIG. 19, the opening 140 may be formed to pass through only the first conductive sheet part 210, and one open side of the opening 140 may be sealed by the second conductive sheet part 320.

Figure 22:
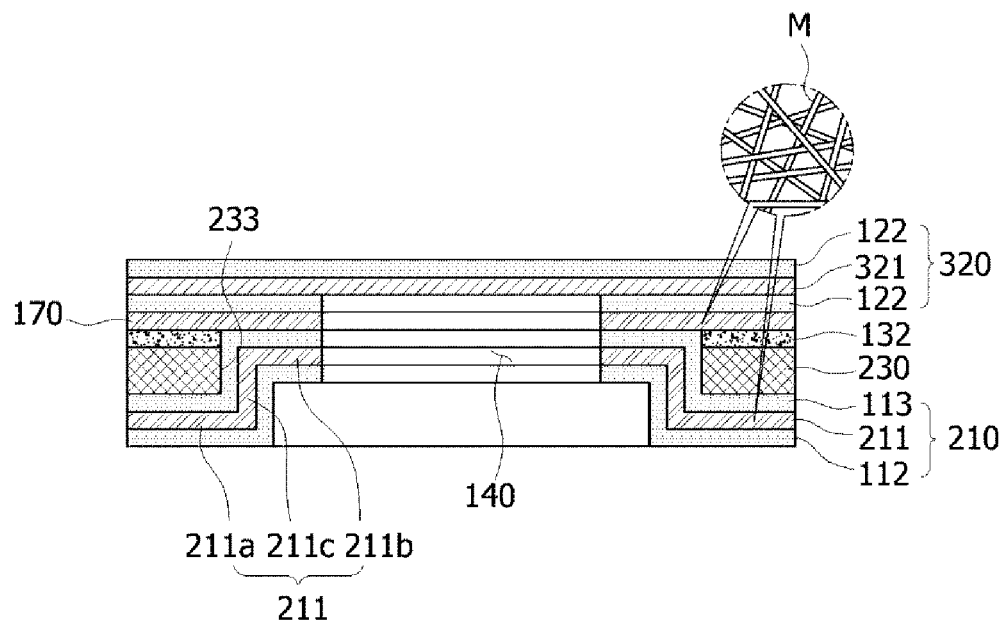
FIG. 22 is a view showing another form of an opening in FIG. 21.

In addition, as illustrated in FIG. 22, in a case in which a conductive fiber web layer 170 formed in a fiber M1 coated with a conductive material M2 and formed to have a three-dimensional network structure is additionally disposed between the first conductive sheet part 210 and the second conductive sheet part 320, the opening 140 may be formed to pass through both of the first conductive sheet part 210 and the conductive fiber web layer 170, and one open side of the opening 140 may also be sealed by the second conductive sheet part 320. In this case, the first conductive sheet part 210 may be directly adhered to the conductive fiber web layer 170 at a peripheral part which defines the edge of the opening 140.

Meanwhile, in the electromagnetic wave shielding sheets 200 and 300 for a shield-can according to one embodiment of the present invention, the size of the first conductive sheet part 110 or 210 and the size of the second conductive sheet part 220 or 320 may be equal to or different from each other. In the present invention, the size of the first conductive sheet part 110 or 210 and the size of the second conductive sheet part 220 or 320 may refer to an area calculated by a length and a width which define an edge, and a meaning of "being relatively large" may be that both of the length and the width are relatively large, or one of the length and the width is the same and the other one is relatively large.

As an example, as illustrated in FIGS. 11 to 16, in a case in which the inner partial area of the overall area of the second conductive sheet 221 corresponding to the second portion 121*b* is convexly formed downward, the size of the second conductive sheet part 220 may be relatively greater than or equal to that of the first conductive sheet part 110. More specifically, a size of the second conductive sheet 221 may be relatively greater than or equal to that of the first conductive sheet 111.

In addition, as illustrated in FIGS. 19 to 23, in a case in which the inner partial area of the overall area of the first conductive sheet 211 corresponding to the second portion 211*b* is convexly formed upward, the size of the first conductive sheet part 210 may be relatively greater than or equal to that of the second conductive sheet part 320. In addition, in a case in which the separate conductive fiber web layer 170 is interposed between the first conductive sheet part 210 and the second conductive sheet part 320, the size of the first conductive sheet part 210 may be relatively greater than or equal to those of the second conductive sheet part 320 and the conductive fiber web layer 170. More specifically, the size of the first conductive sheet 211 may be relatively greater than or equal to that of the second conductive sheet 321 and/or that of conductive fiber web layer 170.

This is to directly attach the second portion 121*b* convexly formed upward to the first conductive sheet part 110 or to directly attach the second portion 211*b* convexly formed downward to the second conductive sheet part 320 or the conductive fiber web layer 170 even though the pressure imparting member 230 disposed between the first conductive sheet 111 or 211 and the second conductive sheet 221 or 321 or between the first conductive sheet 211 and the conductive fiber web layer 170 is deformed by an external force during a punching process in a case in which the opening 140 is formed through the punching process.

In the above-described electromagnetic wave shielding sheets 100, 200, and 300 for a shield-can, in a case in which the opening 140 is formed in a region corresponding to the circuit element 12, a separate unit T or various members configured to perform predetermined functions may also be disposed between the circuit element 12 and the metal bracket 30.

In addition, step compensating members 150 and 250 for compensating for a step between the first portion 121*a* and the second portion 121*b* may also be disposed in the above described electromagnetic wave shielding sheet 100 or 200 for a shield-can (see FIGS. 5, 7, 13, and 15).

That is, each of the step compensating members 150 and 250 may be formed in a ring shape and may be disposed above the second portion 121*b*, and one surface of each of the step compensating members 150 and 250 may be coplanar with the conductive adhesive member 122 disposed on one surface of the second conductive sheet 121 or 221. Each of the step compensating members 150 and 250 may be formed of the same material as the pressure imparting member 130 or 230.

Accordingly, in a case in which the electromagnetic wave shielding sheets 100 and 200 for a shield-can according to one embodiment of the present invention are disposed to be inserted between the shield-can 20 and the metal bracket 30 in a state in which the electromagnetic wave shielding sheets 100 are 200 are compressed, since the step compensating members 150 and 250 may press the second portion 121*b*, the second portion 121*b* may be prevented from being detached from the first conductive sheet parts 110 and 210.

In addition, in the electromagnetic wave shielding sheets 100 and 200 for a shield-can according to one embodiment of the present invention, in a case in which the second conductive sheet part 120 or 220 is formed of the conductive fiber web M having the fiber M1 coated with the conductive material M2 and formed to have the three-dimensional network structure, the metal sheet 160 formed of a metal material in a plate shape may be disposed on one surface of the second conductive sheet part 120 or 220 (see FIGS. 6, 7, 14, and 15). In this case, the metal sheet 160 may be attached to the second conductive sheet part 120 or 220 by the conductive adhesive member 122 included in the second conductive sheet part 120 or 220, and an exposed surface of the metal sheet 160 may be directly in surface contact with the metal bracket 30 when the electromagnetic wave shielding sheet 100 or 200 is used.

Figure 7:
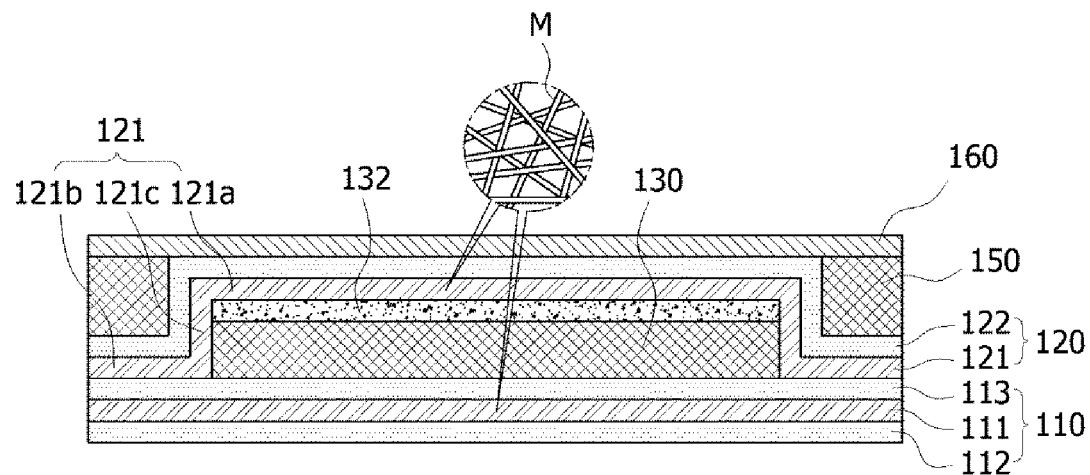
FIG. 7 is a view showing a state in which the metal sheet is applied to that shown in FIG. 6.
Figure 15:
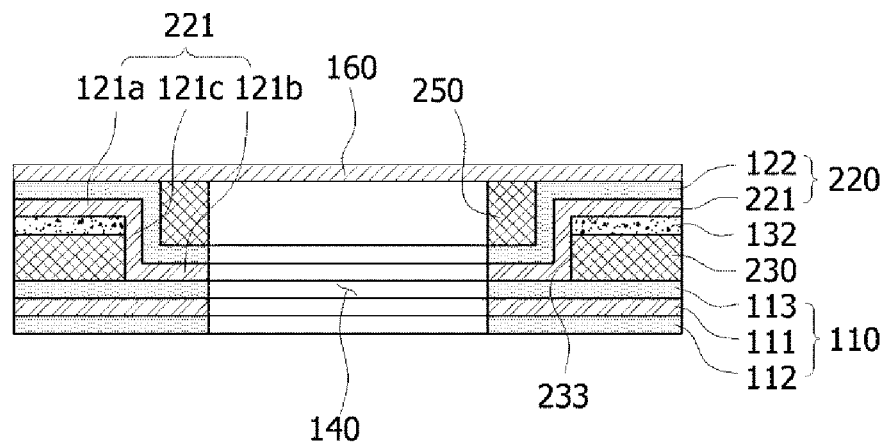
FIG. 15 is a view showing a state in which the metal sheet is applied to that shown in FIG. 13.

Here, as illustrated in FIGS. 7 and 15, in a case in which the step compensating members 150 and 250 are disposed above the second portion 121*b*, the metal sheet 160 may cover both of an upper surface of the first portion 121*a* and an upper surface of the step compensating member 150 or 250.

Figure 21:
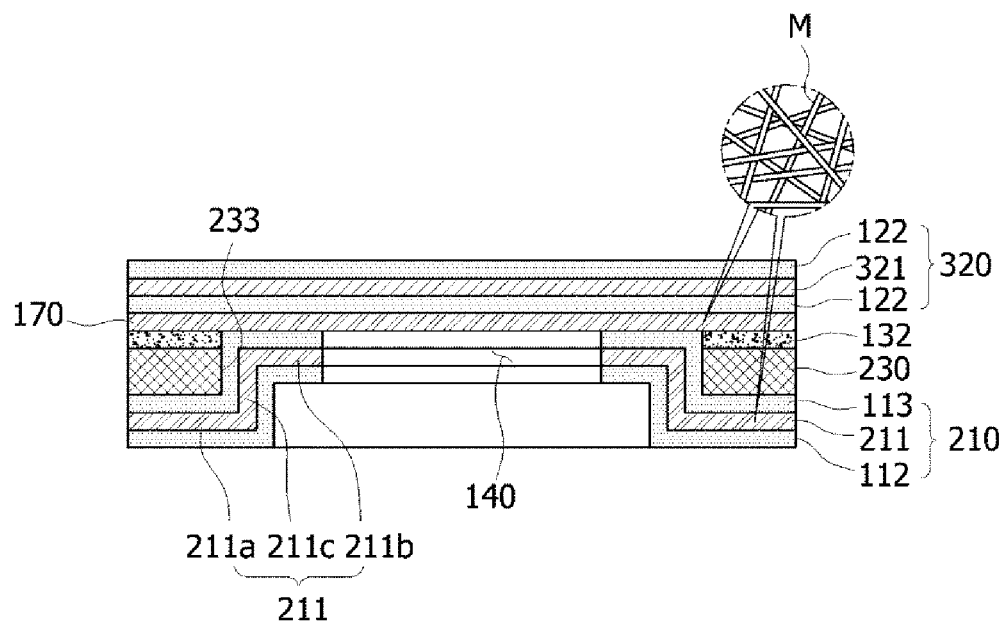
FIG. 21 is a view showing a state in which a conductive fiber web layer is applied between a first conductive sheet part and a second conductive sheet part in FIG. 19.

In addition, in the electromagnetic wave shielding sheet 300 for a shield-can according to one embodiment of the present invention, in a case in which the second conductive sheet part 320 includes a metal sheet having a plate shape, and the second portion 211*b* of the first conductive sheet part 210 is convexly formed upward therein, as illustrated in FIGS. 21 and 22, the separate conductive fiber web (M) layer 170 having the fiber M1 coated with the conductive material M2 and formed to have the three-dimensional network structure may also be additionally disposed between the first conductive sheet part 210 and the second conductive sheet part 320.

Meanwhile, in the above-described electromagnetic wave shielding sheets 100, 200, and 300 for a shield-can, any known conductive adhesive member may be used as the conductive adhesive members 112, 113, and 122 interposed between one or two surfaces of the first conductive sheet 111 or 211 and one or two surfaces of the second conductive sheet 121 or 221. As an example, each of the conductive adhesive members 112, 113, and 122 may be an adhesive matrix on which a filler is dispersed. Here, the adhesive matrix may be formed of one or more resins selected from an acrylic resin and a urethane resin, and the conductive filler may be one or more selected from the group consisting of nickel, nickel-graphite, carbon black, graphite, alumina, copper, and silver. In addition, each of the conductive adhesive members 112, 113, and 122 may have viscosity or adhesion and may also be a non-base materials type member or a base materials type member in which a current may flow in a vertical direction.

In addition, in the above-described electromagnetic wave shielding sheets 100, 200, and 300 for a shield-can, a separate protective film (not shown) for preventing the conductive adhesive members 112 and 122 respectively disposed on one surface of the first conductive sheet 111 or 211 and one surface of the second conductive sheet 121 or 221 from being exposed to the outside may be disposed. The protective film may be a release film which is removable when the described electromagnetic wave shielding sheets 100, 200, and 300 are used.

Meanwhile, it is illustrated and described that each of the first conductive sheets 111 and 211, which are applicable to the present invention, is formed of the conductive fiber web M in which the fiber M1 of which the outer surface is coated with the conductive material M2 is formed in the three-dimensional network structure, but the present invention is not limited thereto, and a metal sheet may also be used as the first conductive sheet 111 or 221 like the second conductive sheet 121 or 221. In this case, each of the second conductive sheets 121 and 221 may also be the above-described metal sheet or may also be formed of the conductive fiber web M in which the fiber M1 of which the outer surface is coated with the conductive material M2 is formed to have the three-dimensional network structure.

While one embodiment of the present invention has been described above, the spirit of the present invention is not limited to the embodiment proposed in this specification, it will be understood by those skilled in the art that other embodiments may be easily suggested by adding, changing, and deleting components, and the other embodiments will fall within the spiritual range of the present invention.

The invention claimed is:

1. An electromagnetic wave shielding sheet for a shield-can, which is disposed between a metal bracket and a shield-can for shielding an electromagnetic wave generated by a circuit element, the electromagnetic wave shielding sheet comprising:
   a first conductive sheet part which includes a first conductive sheet having an electrical conductivity and conductive adhesive members disposed on both surfaces of the first conductive sheet;
   a pressure imparting member which is disposed on one surface of the first conductive sheet part and is compressible by an external force; and
   a second conductive sheet part which includes a second conductive sheet having an electrical conductivity and disposed on one surface of the first conductive sheet part to cover at least one surface of the pressure imparting member and is electrically connected to the first conductive sheet part,
   wherein the second conductive sheet includes:
      a first portion stacked on one surface of the pressure imparting member; and
      a second portion stacked on one surface of the first conductive sheet,
   wherein the first portion and the second portion are formed as a stepped surface,
   wherein at least one opening having a predetermined area is formed in a region corresponding to the circuit element disposed in the shield-can, and
   wherein the opening is formed to pass through both of the pressure imparting member and the second conductive sheet part.

2. The electromagnetic wave shielding sheet of claim 1, wherein at least one of the first conductive sheet and the second conductive sheet is a conductive fiber web in which a fiber of which an outer surface is coated with a conductive material is formed in a three-dimensional network structure.

3. The electromagnetic wave shielding sheet of claim 1, wherein:
   the first conductive sheet is a conductive fiber web in which a fiber of which an outer surface is coated with a conductive material is formed in a three-dimensional network structure; and
   the second conductive sheet is a metal sheet.

4. The electromagnetic wave shielding sheet of claim 3, wherein a conductive fiber web formed of a fiber, which has an outer surface coated with a conductive material and is formed to have a three-dimensional network structure, is further disposed between the first conductive sheet and the second conductive sheet.

5. The electromagnetic wave shielding sheet of claim 1, wherein the pressure imparting member is an elastic member having a non-conductive property.

6. The electromagnetic wave shielding sheet of claim 1, wherein a distance from the first portion to the first conductive sheet is relatively greater than a distance from the second portion to the first conductive sheet.

7. The electromagnetic wave shielding sheet of claim 1, wherein the second portion is formed to surround an edge of the first portion so as to cover an edge of the first conductive sheet.

8. The electromagnetic wave shielding sheet of claim 1, wherein an adhesive member is interposed between a surface of the first portion and a surface of the pressure imparting member which face each other.

9. The electromagnetic wave shielding sheet of claim 1, wherein a step compensating member having a ring shape to compensate for a step with respect to the first portion is disposed on one surface of the second portion.

10. The electromagnetic wave shielding sheet of claim 1, wherein, in a case in which the electromagnetic wave shielding sheet for a shield-can is interposed between the shield-can and the metal bracket, the electromagnetic wave shielding sheet is in a compressed state to have a thickness which is in a range of $1/5$ to $3/10$ of an initial thickness of the electromagnetic wave shielding sheet.

11. An electromagnetic wave shielding sheet for a shield-can, which is disposed between a metal bracket and a shield-can for shielding an electromagnetic wave generated by a circuit element, the electromagnetic wave shielding sheet comprising:
   a first conductive sheet part which includes a first conductive sheet having an electrical conductivity and conductive adhesive members disposed on both surfaces of the first conductive sheet;
   a pressure imparting member which is disposed on one surface of the first conductive sheet part and is compressible by an external force; and
   a second conductive sheet part which includes a second conductive sheet having an electrical conductivity and disposed on one surface of the first conductive sheet part to cover at least one surface of the pressure imparting member and is electrically connected to the first conductive sheet part,
   wherein the first conductive sheet includes:
      a first portion stacked on one surface of the pressure imparting member; and
      a second portion stacked on one surface of the second conductive sheet,
   wherein the first portion and the second portion are formed as a stepped surface,
   wherein the second portion is formed to be located inside the first portion.

12. The electromagnetic wave shielding sheet of claim 11, wherein a distance from the first portion to the second conductive sheet is relatively greater than a distance from the second portion to the second conductive sheet.

13. The electromagnetic wave shielding sheet of claim 11, wherein at least one opening having a predetermined area is formed in a region corresponding to the circuit element disposed in the shield-can.

14. An electromagnetic wave shielding sheet for a shield-can, which is disposed between a metal bracket and a shield-can for shielding an electromagnetic wave generated by a circuit element, the electromagnetic wave shielding sheet comprising:
- a first conductive sheet part which includes a first conductive sheet having an electrical conductivity and conductive adhesive members disposed on both surfaces of the first conductive sheet;
- a pressure imparting member which is disposed on one surface of the first conductive sheet part and is compressible by an external force; and
- a second conductive sheet part which includes a second conductive sheet having an electrical conductivity and disposed on one surface of the first conductive sheet part to cover at least one surface of the pressure imparting member and is electrically connected to the first conductive sheet part,
- wherein the second conductive sheet includes:
- a first portion stacked on one surface of the pressure imparting member; and
- a second portion stacked on one surface of the first conductive sheet,
- wherein the first portion and the second portion are formed as a stepped surface,
- wherein the second portion is formed to be located inside the first portion.

15. The electromagnetic wave shielding sheet of claim 14, wherein the pressure imparting member includes a through part formed to pass through the pressure imparting member so as to surround an edge of the second portion.

16. An electromagnetic wave shielding sheet for a shield-can, which is disposed between a metal bracket and a shield-can for shielding an electromagnetic wave generated by a circuit element, the electromagnetic wave shielding sheet comprising:
- a first conductive sheet part which includes a first conductive sheet having an electrical conductivity and conductive adhesive members disposed on both surfaces of the first conductive sheet;
- a pressure imparting member which is disposed on one surface of the first conductive sheet part and is compressible by an external force; and
- a second conductive sheet part which includes a second conductive sheet having an electrical conductivity and disposed on one surface of the first conductive sheet part to cover at least one surface of the pressure imparting member and is electrically connected to the first conductive sheet part,
- wherein the second conductive sheet includes:
- a first portion stacked on one surface of the pressure imparting member; and
- a second portion stacked on one surface of the first conductive sheet,
- wherein the first portion and the second portion are formed as a stepped surface,
- wherein at least one opening having a predetermined area is formed in a region corresponding to the circuit element disposed in the shield-can,
- wherein the opening is formed to pass through the second conductive sheet part.

* * * * *